(12) United States Patent
Mehta et al.

(10) Patent No.: US 11,347,403 B2
(45) Date of Patent: May 31, 2022

(54) EXTENDING THE LIFE OF A SOLID STATE DRIVE BY USING MLC FLASH BLOCKS IN SLC MODE

(71) Applicant: Seagate Technology LLC, Fremont, CA (US)

(72) Inventors: Darshana H. Mehta, Shakopee, MN (US); Antoine Khoueir, Mound, MN (US)

(73) Assignee: Seagate Technolagy LLC, Fremont, CA (US)

( * ) Notice: Subject to any disclaimer, the term of this patent is extended or adjusted under 35 U.S.C. 154(b) by 379 days.

(21) Appl. No.: 16/560,858

(22) Filed: Sep. 4, 2019

(65) Prior Publication Data
US 2021/0064249 A1  Mar. 4, 2021

(51) Int. Cl.
*G06F 3/06* (2006.01)
*G06F 11/07* (2006.01)
*G06F 11/20* (2006.01)
*G11C 29/00* (2006.01)

(52) U.S. Cl.
CPC .......... *G06F 3/0616* (2013.01); *G06F 3/0634* (2013.01); *G06F 3/0679* (2013.01); *G06F 11/0727* (2013.01); *G06F 11/0751* (2013.01); *G06F 11/0793* (2013.01); *G06F 11/2094* (2013.01); *G11C 29/70* (2013.01)

(58) Field of Classification Search
CPC .... G06F 3/0616; G06F 3/0634; G06F 3/0679; G06F 11/0727; G06F 11/0751; G06F 11/0793; G06F 11/2094; G06F 11/1666; G06F 2212/7204; G06F 11/1048; G06F 12/0246; G11C 29/70
See application file for complete search history.

(56) References Cited

U.S. PATENT DOCUMENTS

| | | |
|---|---|---|
| 8,407,400 B2 | 3/2013 | Marotta et al. |
| 8,667,215 B2 | 3/2014 | Marotta et al. |
| 8,972,776 B2 | 3/2015 | Baryudin et al. |
| 9,123,422 B2 | 9/2015 | Yu et al. |
| 9,298,603 B2 | 3/2016 | Schuette |
| 9,606,737 B2 | 3/2017 | Kankani et al. |
| 9,639,282 B2 | 5/2017 | Kankani et al. |
| 9,804,960 B2 | 10/2017 | Bleyer et al. |
| 9,864,525 B2 | 1/2018 | Kankani et al. |
| 10,229,735 B1 | 3/2019 | Natarajan et al. |
| 2014/0095110 A1 | 4/2014 | Chen et al. |
| 2016/0162185 A1 | 6/2016 | D'Abreu et al. |

(Continued)

*Primary Examiner* — Mohammed A Bashar
(74) *Attorney, Agent, or Firm* — Taylor English Duma LLP

(57) ABSTRACT

Technologies are described herein for or extending the lifespan of a solid-state drive by using worn-out MLC flash blocks in SLC mode to extend their useful life. Upon identifying a first storage location in the storage media of an SSD as a candidate for defecting, the first storage location is switched from a first programming mode to a second programming mode, where the second programming mode results in a lower storage density of storage locations than the first programming mode. In conjunction with switching the first storage location to the first programming mode, a second storage location in the storage media is switched from the second programming mode to the first programming mode to ensure that the total capacity of the storage media remains at or above the rated capacity.

18 Claims, 12 Drawing Sheets

(56) References Cited

U.S. PATENT DOCUMENTS

| | | |
|---|---|---|
| 2019/0066736 A1 | 2/2019 | Stichka et al. |
| 2019/0095116 A1* | 3/2019 | Igahara ................. G06F 3/0619 |
| 2019/0294358 A1* | 9/2019 | Suzuki ................. G06F 3/0611 |
| 2020/0073795 A1* | 3/2020 | Asano ................... G06F 3/0679 |

* cited by examiner

EXTENDING THE LIFE OF A SOLID STATE DRIVE BY USING MLC FLASH BLOCKS IN SLC MODE

BRIEF SUMMARY

The present disclosure relates to technologies for extending the lifespan of a solid-state drive by using worn-out MLC flash blocks in SLC mode to extend their useful life. According to some embodiments, a method for extending the lifespan of a solid-state drive comprises, upon identifying a first storage location in the storage media as a candidate for defecting, switching the first storage location from a first programming mode to a second programming mode, where the second programming mode results in a lower storage density of storage locations than the first programming mode. In conjunction with switching the first storage location to the first programming mode, a second storage location in the storage media is switched from the second programming mode to the first programming mode to ensure that the total capacity of the storage media remains at or above the rated capacity.

According to further embodiments, a storage device comprises a non-volatile memory comprising a plurality of storage locations. A first portion of the storage locations is configured to be programmed in a first programming mode, and a second portion of the storage locations is configured to be programmed in a second programming mode, where the second programming mode resulting in a lower storage density of the storage locations than the first programming mode. The storage device further comprises a controller for storing user data from a host to the non-volatile memory. The controller is configured to, upon detecting an error in a first storage location within the first portion of the storage locations, switch the first storage location from the first programming mode to the second programming mode. In conjunction with switching the first storage location, the controller switches a second storage location within the second portion of the storage locations from the second programming mode to the first programming mode.

According to further embodiments, a computer-readable medium has processor-executable instructions stored thereon that, when executed by a processor, cause the processor to initially provision a non-volatile memory of a storage device with a first pool of storage locations configured to utilize a multi-level cell ("MLC") mode and a second pool of storage locations configured to be utilize single-level cell ("SLC") mode. The size of the first pool and the second pool of the storage locations are set based on a predetermined proportion of storage locations utilizing the MLC mode to storage locations utilizing SLC mode for the storage device. The processor is further caused to, in response to identifying a first storage location in the first pool as a candidate for defecting, switch the first storage location from the MLC mode to SLC mode. In conjunction with switching the first storage location, the processor switches a second storage location in the second pool from SLC mode to the MLC mode.

These and other features and aspects of the various embodiments will become apparent upon reading the following Detailed Description and reviewing the accompanying drawings.

BRIEF DESCRIPTION OF THE DRAWINGS

In the following Detailed Description, references are made to the accompanying drawings that form a part hereof, and that show, by way of illustration, specific embodiments or examples. The drawings herein are not drawn to scale. Like numerals represent like elements throughout the several figures.

DETAILED DESCRIPTION

Figure 1:
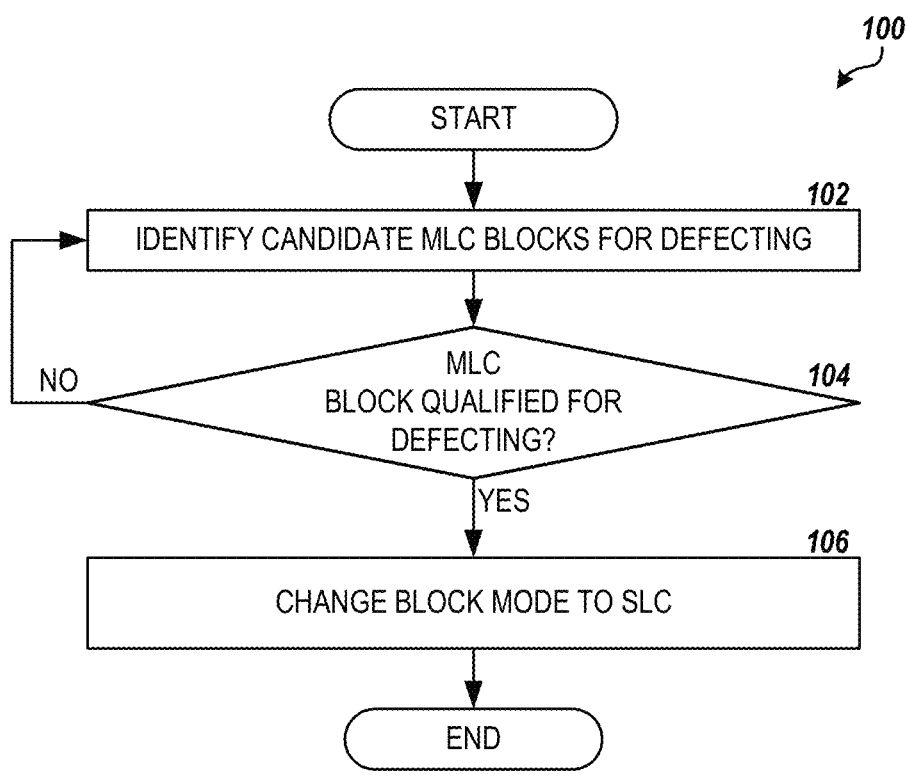
FIG. 1 is a flow diagram showing one routine for an extending the lifespan of an SSD by using worn-out MLC blocks in SLC mode, according to embodiments described herein.

The following detailed description is directed to technologies for extending the lifespan of a solid-state drive ("SSD") by using multi-level cell ("MLC") flash blocks that otherwise would have been marked as defective in single-level cell ("SLC") mode to extend their useful life. The storage media utilized in SSDs and other storage devices comprises of arrays of individual storage cells, such as NAND flash cells. Generally, an entire array is referred to as a block, while the individual rows that make up an array are referred to as pages. Each cell can hold one, two, three, or more bits of data depending on the cell technology utilized. For example, the following types of NAND flash cells may be utilized:

Single-level Cell ("SLC"): each cell can exist in one of two voltage states (either above or below a single reference level), thus can store a single bit of data per cell.

Multi-level Cell ("MLC"): each cell has four possible voltage states and can store two bits of data per cell.

Triple-level Cell ("TLC"): each cell has eight possible voltage states and can store three bits of data per cell.

Quad-level Cell ("QLC"): each cell has sixteen possible voltage states and can store four bits of data per cell.

In this document, "MLC" is utilized to refer to both cells storing two bits of data and, more generally, to any type of storage cell that can hold more than a single bit of data per cell, i.e., all non-SLC cell types, inclusive of QLC, TLC, and MLC.

Because of the nature of the operation of NAND cells, data in NAND flash memory generally cannot be overwritten, and cells must be erased before new data is written to them. While the data in flash memory may be read and written at the page level, erasing must be done at the block level. Therefore, data may only be programmed to a page in a block that has previously been erased. Each time data is erased and programmed in a NAND flash cell, there is a small amount of damage to the cell. After many program/erase cycles on a cell, electrons may be trapped, shifting the voltage distributions of the cell. As these voltage distributions get larger, they start to overlap between the various voltage states of the cell and can cause unrecoverable read errors. When unrecoverable errors occur in one or more cells of a block, the block may be marked as defective, or "defected." Increasing numbers of defective blocks over the life of the storage device results in fewer free blocks, causing an increase in write amplification in the flash memory, which can result in performance variation in the device (or across various cooperative devices in a storage system) and/or reduced storage capacity.

The expected lifespan of a block of flash memory can depend on the type of cells. While MLC cells can store twice as much data per block, the MLC cells have lower endurance, about 10,000 program/erase cycles, than SLC cells, which can endure about 100,000 program/erase cycles, because of the wider read window margin involved in reading the state of SLC cells over MLC cells. TLC offers an even higher density of storage, but with a lower endurance of about 3,000 to 5,000 program/erase cycles, while QLC offers 4 times the data storage per block of SLC, but with an expected lifetime of only about 1500 program/erase cycles. In addition to higher endurance, SLC cells generally have faster access and programming times than MLC cells, with the reads being more reliable (lower raw bit error rates ("RBERs")). Also, SLC cells have lower power consumption than MLC cells and better operating temperature range.

An SSD or storage device utilizing MLC flash memory may implement several techniques to maximize the lifespan of the flash memory. For example, the SSD may implement a wear-leveling routine to ensure that all blocks are exercised uniformly, maximizing the lifespan of the device. In addition, the SSD may contain extra NAND flash memory above its stated capacity, known as overprovisioning. As flash memory blocks wear-out, these extra memory blocks can be allocated to take their place. While overprovisioning improves SSD performance and lifespan, it adds additional manufacturing cost to the device.

According to embodiments described herein, an SSD or other storage device may further implement a block programming mode switching scheme that allows the device to, instead of retiring worn-out blocks of MLC cells, program and access the MLC cells of the block as if they were SLC cells, referred to herein as "switching the programming mode of the block to SLC mode." More generally, the block programming mode switching scheme supports switching any block from a higher-level MLC mode (e.g., QLC) to SLC mode or a lower-level MLC mode (e.g., TLC) when read failure(s) are detected or the block is otherwise targeted for defecting. While switching the programming mode of the block to SLC mode or a lower-level MLC mode reduces the data capacity, the read margins for the cells in the block are increased, allowing continued utilization of blocks which are unusable in higher-level programming modes, thereby reducing total number of defective blocks in the storage device.

FIG. 1 illustrates one routine for extending the lifespan of an SSD by using MLC blocks in SLC mode, according to the embodiments described herein. According to some embodiments, the routine 100 may be performed by a controller of an SSD or other storage device implementing MLC flash memory. The routine 100 includes step 102, where MLC blocks are identified as candidates for defecting. This may be due to some number of unrecoverable read errors or some number of read retries for a read of data from the block. Alternatively, this may be due to the triggering of RAISE recovery from the read of an R-BLOCK that includes the MLC block, or some other indication of unreliability or wear in the MLC block.

If the MLC block is identified as a candidate for defecting, the routine 100 proceeds from step 102 to step 104, where it is determined whether the block is qualified as a defect. This may be determined by executing a series of read tests on the MLC block and measuring the RBERs. If it is determined that the block is qualified as a defect, the routine proceeds from step 104 to step 106, where the programming mode for the block is switched from MLC mode to SLC mode. This may involve copying the data from the block to another free block in the flash memory, switching the programming mode of the block to SLC mode, and performing an erase operation on the block. Once the programming mode is switched to SLC mode, the SLC block can be returned to the flash memory as a free block for continued use, albeit at a reduced capacity. From step 106, the routine 100 ends.

It will be appreciated that the routine 100 could further be performed on a defective or worn-out higher-level MLC block, such as a QLC block, switching the programming mode to a lower-level MLC mode, such as TLC mode, according to further embodiments. In some embodiments, continued use of the routine 100 may switch the programming mode of a particular QLC block of flash memory in an SSD or other storage device to TLC, to MLC, and then to SLC over the lifespan of the device as required. It will be appreciated that this will allow the block to continue to contribute to the total storage and/or performance of the SSD well beyond the expected lifespan of the block in QLC mode.

Figure 2:
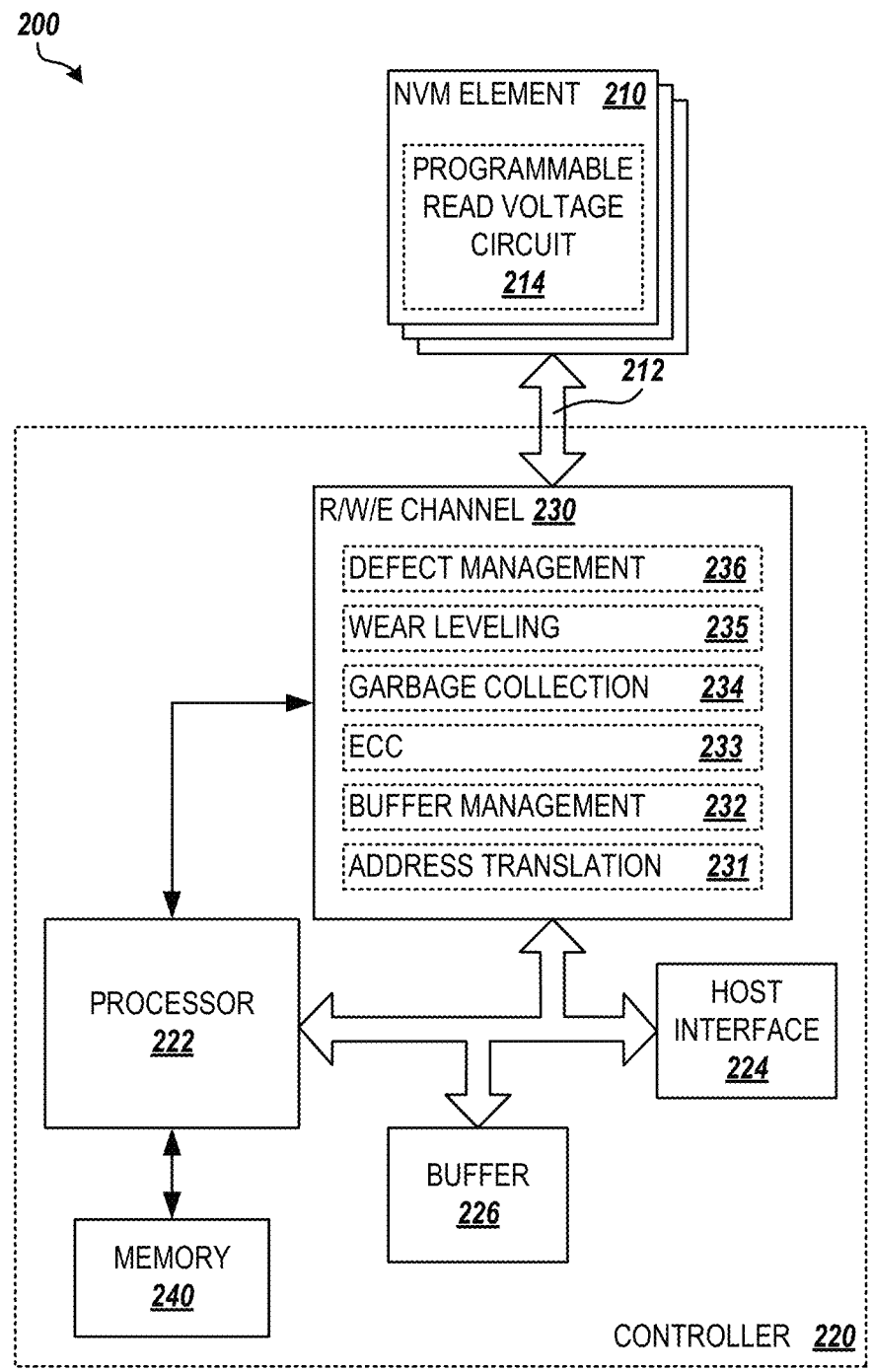
FIG. 2 is a block diagram showing components of an illustrative storage device in which the embodiments described herein may be implemented.

FIG. 2 and the following description are intended to provide a general description of a suitable environment in which the embodiments described herein may be implemented. In particular, FIG. 2 shows an illustrative storage device 200, such as an SSD device, along with hardware, software and components for extending its lifespan by using worn-out MLC flash blocks in SLC mode to extend their useful life, according to the embodiments provided herein. The storage device 200 may include storage media comprising one or more non-volatile memory ("NVM") elements 210. In some embodiments, the NVM elements 210 comprise of NAND flash memory dies. In other embodiments, the NVM elements 210 may comprise NAND flash memory, NOR flash memory, vertical NAND ("V-NAND") or 3D NAND flash memory, flash memory using polysilicon or silicon nitride technology-based charge storage cells, phase-change memory ("PCM"), racetrack memory, or any other type of solid-state storage media or technology in which individual storage locations or cells can store two or more data bits (e.g. MLC).

Figure 3:
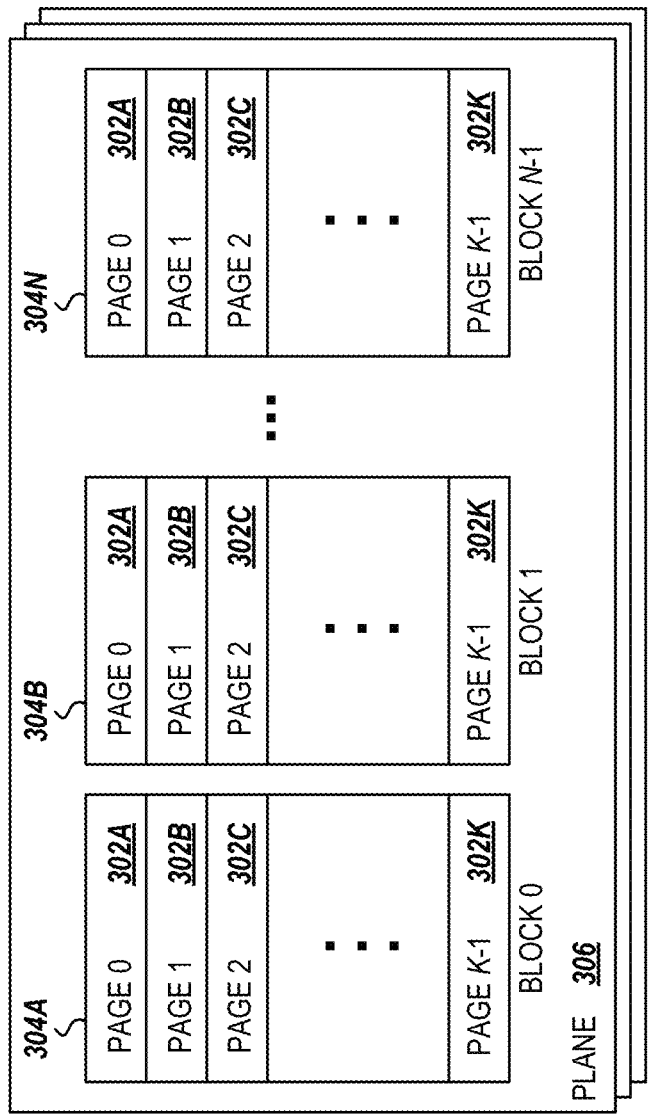
FIG. 3 is a block diagram showing an exemplary storage layout of a NAND flash die, according to embodiments described herein.

FIG. 3 shows one exemplary storage layout of an individual NVM element 210 comprising a multi-layered NAND flash die. The individual storage cells of the NVM element 210 are organized in multiple arrays. Each array constitutes a block, such as block 0 through block N−1 304A-304N (referred to generally as block 304), with the rows of each array constituting pages within the block, such as page 0 through page K−1 302A-302K (referred to generally as page 302). Each of the multiple layers of the NVM element 210 contains blocks 0 through N−1, and is referred to as a plane 306. The storage capacity of a particular NVM element 210 depends on the programming mode utilized by the storage cells (i.e., the number of bits stored per cell), the number of cells per row (page 302), the number of pages per block 304, the number of blocks per plane 306, and the number of planes (layers) in the NVM element. Common page sizes include 2 KB, 4 KB, 8 KB, or 16 KB, with 128, 256, 512, or 1536 pages 302 per block 304. Block sizes, therefore, typically vary between 128 KB and 24 MB.

Returning to FIG. 2, the storage device 200 may further comprise a controller 220 that controls the operations of the storage device. According to various embodiments, the controller interfaces with the NVM elements 210 through one or more device interfaces 212. According to some embodiments, the device interface(s) 212 comprises of an Open NAND Flash Interface ("ONFI") compatible interface. In further embodiments, the device interface(s) 212 may comprise of one or more of an asynchronous interface; a synchronous interface; a single-data-rate ("SDR") interface; a double-data-rate ("DDR") interface; a toggle-mode compatible flash interface; a non-standard version of any of the preceding interfaces; a custom interface; or any other type of interface used to communicate with the NVM elements 210.

The device interface(s) 212 may be organized into one or more channels (not shown), with each NVM element 210 connected through one channel. Each channel may support some number P of NVM elements 210. For example, the device interface 212 may comprise 8 channels, connected to 2 NVM elements 210 each, for a total of 16 NVM elements. The controller 220 may be enabled to access NVM elements 210 on separate channels simultaneously. In further embodiments, the device interface(s) 212 may be organized in one or more groups of channels with one or more of NVM elements 210 per channel, or any other organization of one or more of the NVM elements 210 onto the device interface(s) 212.

The controller 220 may include a processor 222 to monitor and control the operations of the storage device 200. The processor 222 may represent one or more single-core or multi-core processors known in the art. The controller 220 may further include a host interface 224 allowing the storage device 200 to communicate with one or more host devices or other components (not shown), such as a server computer, personal computer ("PC"), laptop, tablet, game console, set-top box, a storage-area controller, or any other electronics device that can be communicatively coupled to the storage device 200 to store and retrieve data from the storage device. In some embodiments, the controller may be connected to the host device(s) through the host interface 224 via a switch/fabric/intermediate controller (not shown) or some other intermediate device. According to some embodiments, the host interface may be compatible with a Serial ATA ("SATA") interface standard. In further embodiments, the host interface 224 may be compatible with one or more of an IDE interface standard, a SCSI interface standard, a SAS interface standard, a PCIe interface standard, a USB interface standard, a CF interface standard, an MMC interface standard, an SD interface standard, and the like.

The controller 220 may process read and write commands from the host device(s) by formatting the associated data and transfer the formatted data via a read/write/erase channel 230 to the target NVM elements 210 through the device interface(s) 212. The read/write/erase channel 230 includes the necessary modules and/or circuits to erase, encode, write, read, and decode data from the NVM elements 210. According to embodiments, the read/write/erase channel 230 includes an address translation module 231 that provides translations between data addressing utilized by the host device(s), e.g., logical bock addresses ("LBAs"), and data addressing used by the device interface(s) 112 for the NVM elements 210.

The read/write/erase channel 230 may further include a buffer management module 232 that manages a buffer 226 for the temporary storage of user data and metadata associated with the NVM elements 210 during various access (read and write) operations, according to some embodiments. For example, the buffer 226 may temporarily store write data pending verify operations upon data being programmed to the NVM elements 210. In some embodiments, the buffer 226 may comprise a local memory, such as static random access memory ("SRAM") or dynamic random access memory ("DRAM") onboard the controller 220. In further embodiments, the buffer may include one or more external SRAM or DRAM memories and/or a buffer area in one or more of the NVM elements 210.

In further embodiments, the read/write/erase channel 230 includes an error-correcting code ("ECC") module 233 that provides error correction and/or redundancy functions in the reading or writing of data to and from the NVM elements 210. For example, the ECC module 233 may calculate and write ECC bits along with data programmed to the NVM elements 210. When the data is read back from the NVM elements 210, the ECC module 233 may utilize the ECC bits to correct any read errors. In some embodiments, the ECC algorithms utilized by the ECC module 233 may change from weaker codes gradually moving towards stronger codes as the NVM elements 210 age.

The read/write/erase channel 230 may also include a garbage collection module 234 and a wear-leveling module 235, according to further embodiments. The garbage collection module 234 performs garbage collection by erasing unused blocks 304 of the NVM elements 210 to make them eligible to be re-written with new data. The garbage collection module 234 may be further enabled to move stored data within or between the NVM elements 210 to make larger contiguous portions of the flash memory available for writing. The wear-leveling module 235 works to ensure program/erase cycles are distributed evenly across all blocks 304 in the NVM elements 210 in order to avoid some prematurely wearing out before other blocks, potentially impacting performance and shortening the lifespan of the storage device 200. For example, wear-leveling module 235 may track a recycle count of each block 304 in the NVM elements 210 in order to allow level use of free blocks for new writes.

In further embodiments, the read/write/erase channel 230 includes a defect management module 236. The defect management module 236 may detect and deal with bad blocks 304 in the NVM elements 210 when the blocks become unusable or unreliable for the storage of data. This may include marking the block 304 as defective and substituting a block from a spare area in the NVM elements 210 for storage of the data in a defective block. According to the embodiments described herein, the defect management module 236 may be further configured to switch the programming mode of a bad block 304 from a higher-level mode, such as QLC, TLC, or MLC, to a lower-level mode, such as TLC, MLC, or SLC, when the block becomes unusable in the higher-level mode, thus extending the useful life of the block and maintaining the performance and storage capacity of the storage device 200 over its lifespan. The current programming mode of each block 304 in the NVM elements 210 may be tracked by the controller 220 to allow the programming mode of the block to be adjusted when required. In some embodiments, the controller 220 is able to effect the programming mode of each block 304 in the NVM elements 210. The programmable read voltage circuit 214 allows the controller 220 to selectively adjust NVM read thresholds used to read the cells of the block 304 in the current programming mode.

It will be appreciated that the defect management module 236, the wear-leveling module 235, the garbage collection module 234, the ECC module 233, the buffer management module 232, and the address translation module 231 may comprise hardware circuits in the read/write/erase channel 230, processor-executable instructions for execution in the processor 222, or any combination of these and other components in the controller 220.

The controller 220 may further include a computer-readable storage medium or "memory" 240 for storing processor-executable instructions, data structures, and other information. The memory 240 may comprise a non-volatile memory, such as read-only memory ("ROM") and/or flash memory, and a random-access memory ("RAM"), such as SRAM or DRAM. The memory 230 may further comprise a portion of the non-volatile storage media of the storage device 200. For example, the memory 230 may store a firmware that comprises commands and data necessary for performing the operations of the storage device 200. According to some embodiments, the memory 240 may store processor-executable instructions that, when executed by the processor 222, perform the routines 100 and 600 for extending the lifespan of the storage device 200 by using worn-out MLC blocks in SLC mode, as described herein.

The memory 240 may further store supporting data utilized by the read/write/erase channel 230, such as mapping tables utilized by the address translation module 231 and the garbage collection module 234, erase/recycle count tables utilized by the wear-leveling module 235, and defective blocks lists, a list of current block programming modes, RBERs per block, and/or block counts for dynamic and static pools of each programming mode utilized by the defect management module 236, among other information. In further embodiments, the current programming mode of the blocks 304 may be tracked within the supporting data for other functions stored in the memory 240, such as in the erase/recycle count tables or mapping tables.

In addition to the memory 240, the environment may include other computer-readable media storing program modules, data structures, and other data described herein for extending the lifespan of the storage device 200 by using worn-out MLC blocks in SLC mode. It will be appreciated by those skilled in the art that computer-readable media can be any available media that may be accessed by the controller 220 or other computing system for the non-transitory storage of information. Computer-readable media includes volatile and non-volatile, removable and non-removable recording media implemented in any method or technology, including, but not limited to, RAM, ROM, erasable programmable ROM ("EPROM"), electrically-erasable programmable ROM ("EEPROM"), flash memory or other solid-state memory technology, compact disc ROM ("CD-ROM"), digital versatile disk ("DVD"), or other optical storage, magnetic cassettes, magnetic tape, magnetic disk storage or other magnetic storage devices and the like.

It will be appreciated that the structure of the storage device 200 may be different that that illustrated in FIG. 2 and described herein. For example, the processor 222, read/write/erase channel 230, memory 240, and other components and circuitry of the storage device 200 may be integrated within a common integrated circuit package, such as a system-on-chip ("SoC"), or they may be distributed among multiple integrated circuit packages. Similarly, the illustrated connection pathways are provided for purposes of illustration and not of limitation, and some components and/or interconnections may be omitted for purposes of clarity. It will be further appreciated that the storage device 200 may not include all of the components shown in FIG. 2, may include other components that are not explicitly shown in FIG. 2 or may utilize an architecture completely different than that shown in FIG. 2.

Figure 4:
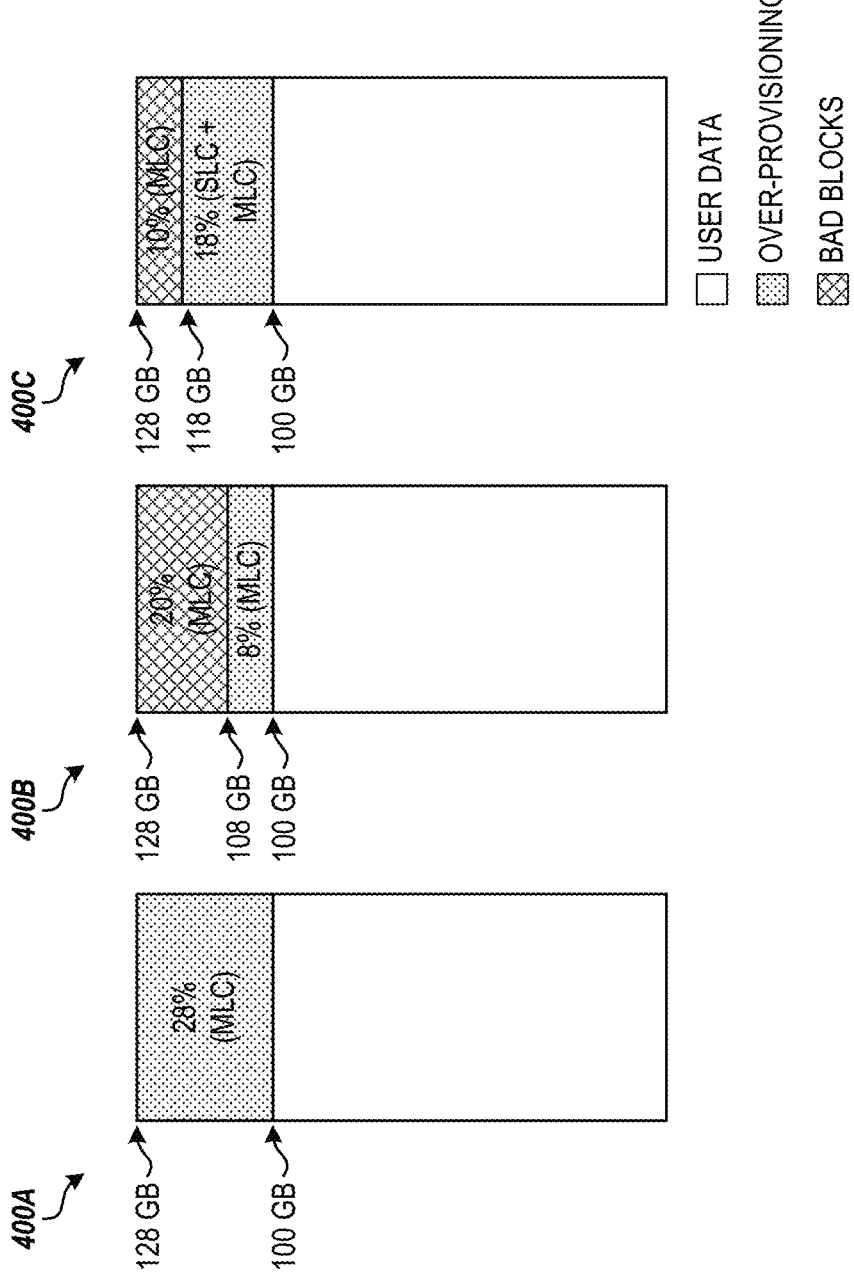
FIG. 4 is a block diagram showing details of one scheme for extending the lifespan of an SSD by using worn-out MLC blocks in SLC mode using overprovisioning, according to embodiments described herein.

FIG. 4 provides additional details of one scheme for extending the lifespan of an SSD by using worn-out MLC blocks in SLC mode, according to some embodiments. In order for an SSD or other storage device 200 utilizing flash memory to maintain capacity despite blocks of the flash memory becoming defective or "wearing out," the SSD may be manufactured with extra flash memory above its rated capacity. This is known as overprovisioning. As individual blocks of flash memory are retired, these extra memory blocks can be allocated take their place. The existence of the extra memory blocks not only provides for maintaining the storage capacity of the SSD but may improve general performance in the SSD by providing extra free blocks and avoiding write amplification.

For example, as shown at 400A, an SSD 200 implementing MLC flash memory may be overprovisioned at 28%. In other words, the rated capacity of the SSD may be 100 GB but the total capacity of the flash memory may be 128 GB. The extra capacity comes from additional MLC blocks 304 in the NVM elements 210. In a typical overprovisioning scenario, as MLC blocks 304 wear out during the lifecycle of the SSD, the blocks are marked as defective or "bad blocks" and are no longer available for use, and are replaced with MLC blocks from the overprovisioned flash memory. As shown at 400B, if 20% of the rated capacity of MLC blocks 304 have been marked as defective and are unavailable for use, then only 8% overprovisioned capacity remains available.

According to embodiments, however, an SSD or storage device 200 incorporating the technologies described herein may use the worn-out MLC blocks in SLC mode instead of marking them as defective, resulting in an increased overall overprovisioned capacity. Specifically, as shown at 400C, if 20% of the rated capacity of MLC blocks 304 are worn-out and replaced by blocks from the overprovisioning capacity, then the defect management module 236 may switch the programming mode of the worn-out MLC blocks to SLC mode, effectively halving the capacity of these blocks. However, because SLC cells have a higher endurance than MLC cells, the usable life the cells is increased.

Switching the worn-out MLC blocks 304 to SLC mode results in a remaining overprovisioned capacity of 18% instead of just 8% in the conventional overprovisioning scenario. The increase in overprovisioned space means more free blocks 304 available for erasing and programming of the flash memory, reducing write amplification and increasing the lifespan and performance of the storage device 200. Further, NAND flash operated in SLC mode typically has lower program and access times than when used in MLC mode, thus the overall I/O performance of the storage device 200 may further be increased. In addition, the blocks operated in SLC mode may utilize weaker ECC algorithms than those operated in MLC mode, resulting in an additional increase in performance and decrease in write amplification.

Figure 5:
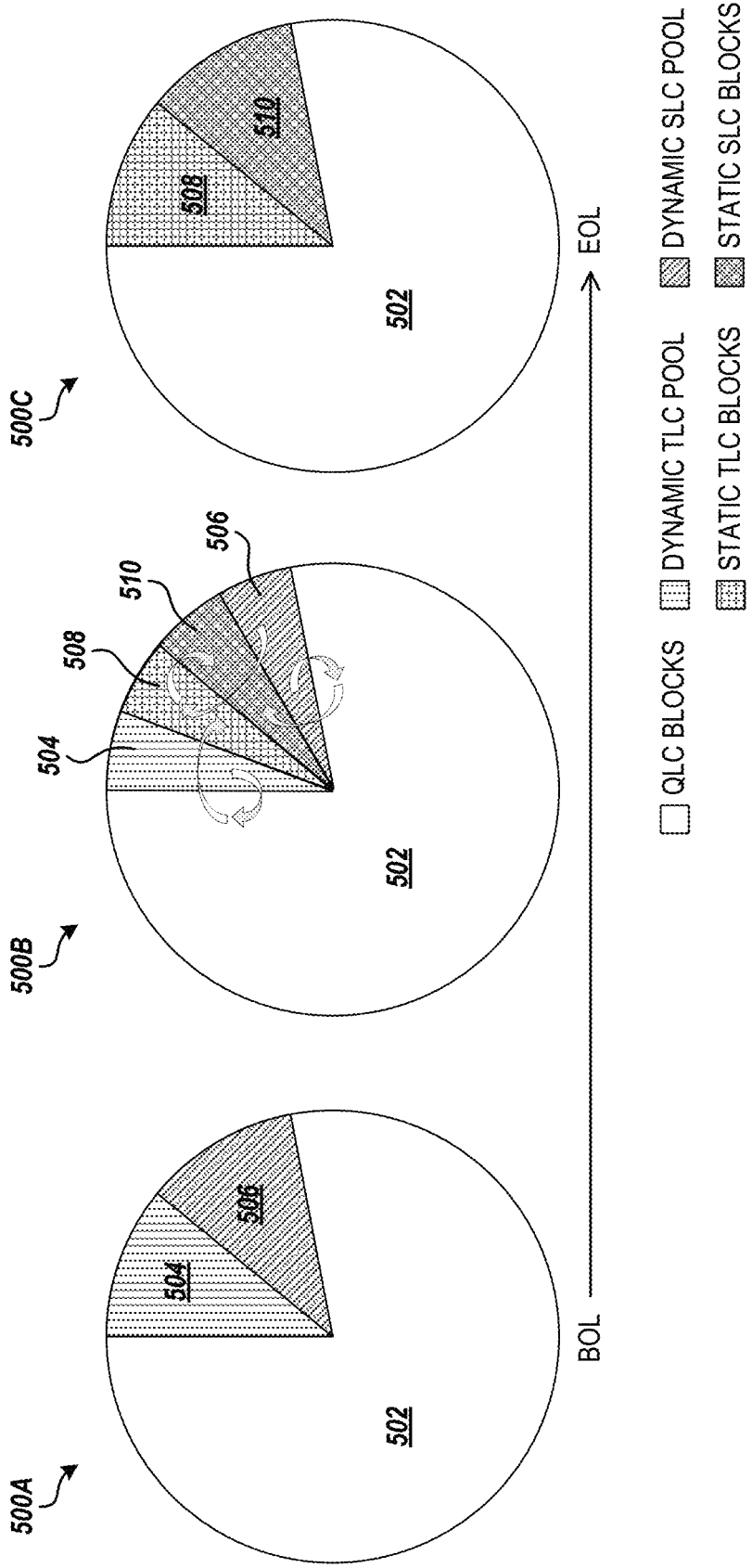
FIG. 5 is a block diagram showing details of another scheme for extending the lifespan of an SSD by using worn-out MLC blocks in SLC mode while maintaining capacity and performance, according to embodiments described herein.

FIG. 5 provides additional details of another scheme for extending the lifespan of an SSD by using worn-out QLC blocks in lower-level MLC modes or SLC mode, according to some embodiments. According to embodiments, an SSD or other storage device 200 utilizing QLC NAND flash memory may be initially provisioned with a first dynamic pool of blocks 304 configured to be programmed in TLC mode, and a second dynamic pool of blocks configured to be programmed in SLC mode. As shown in 500A, the total capacity of the SSD 200 at beginning-of-life ("BOL") would comprise the capacity of the QLC blocks 502 as well as the capacity of the blocks in the dynamic TLC pool 504 and the blocks in the dynamic SLC pool 506. During operation of the SSD 200 over it lifecycle, as QLC blocks 502 are identified as being defective, i.e., unusable in QLC mode, the defect management module 236 or some other function of the controller 220 may swap the worn-out QLC blocks for blocks from the dynamic TLC pool 504 or the dynamic SLC pool 506 instead of defecting the blocks.

For example, as shown at 500B, when a particular QLC block 502 is identified as being unusable in QLC mode, the defect management module 236 may switch the mode of the defective QLC block to TLC mode, the block now counted among a group of static TLC blocks 508. At the same time, the defect management module 236 may allocate a replacement block from the dynamic TLC pool 504 and switch the programming mode of the replacement block to QLC. In this way, the proportion of blocks operating in QLC mode to blocks operating in TLC mode is maintained. Thus, the total capacity of the QLC blocks 502 and TLC blocks (the dynamic TLC pool 504 and the static TLC pool 508) in the storage device remain constant.

Similarly, if a block in the static TLC pool 508 is identified as being no longer usable in TLC mode, the defect management module 236 may switch the mode of the defective block to SLC mode, the block now be counted among a group of static SLC blocks 510. At the same time, the defect management module 236 may allocate a replacement block from the dynamic SLC pool 506 and switch the programming mode of the replacement block to TLC. As in the previous example, the proportions of blocks operating in TLC mode and blocks operating in SLC mode to all blocks are maintained. A similar operation could be utilized to swap a defective QLC block 502 with a block from the dynamic SLC pool 506, as further shown in 500B, if no blocks were available in the dynamic TLC pool 504, according to further embodiments.

At some point in the lifecycle of the storage device 200, the dynamic TLC and SLC pools will be exhausted with the original allotment of TLC and SLC blocks in the NAND flash memory being taken up by static TLC blocks 508 or SLC blocks 510, respectively. At this point, QLC blocks 502 subsequently determined to be unusable in QLC mode may be marked by the defect management module 236 as defects, or handled in some other conventional end-of-life ("EOL") methodology, according to embodiments.

By maintaining the proportion of TLC blocks and/or SLC blocks to all blocks, the capacity and performance of the SSD is preserved. This may be important for realizing manufacturer's ratings for the device over its lifetime, as well as maintaining consistence capacity and performance when the device is used in an array of like devices in a storage array, for example. According to embodiments, the proportions of TLC and/or SLC blocks to all blocks may be maintained per device, per channel, per die (NVM element 210), per layer (plane 306), or at some other level. In further embodiments, transitioning QLC blocks from QLC mode to TLC mode to SLC mode can be done independently of the pre-determined pools and proportions if potential performance variation and/or capacity reduction is acceptable, e.g., when lifetime of the device is the main concern.

Figure 6A:
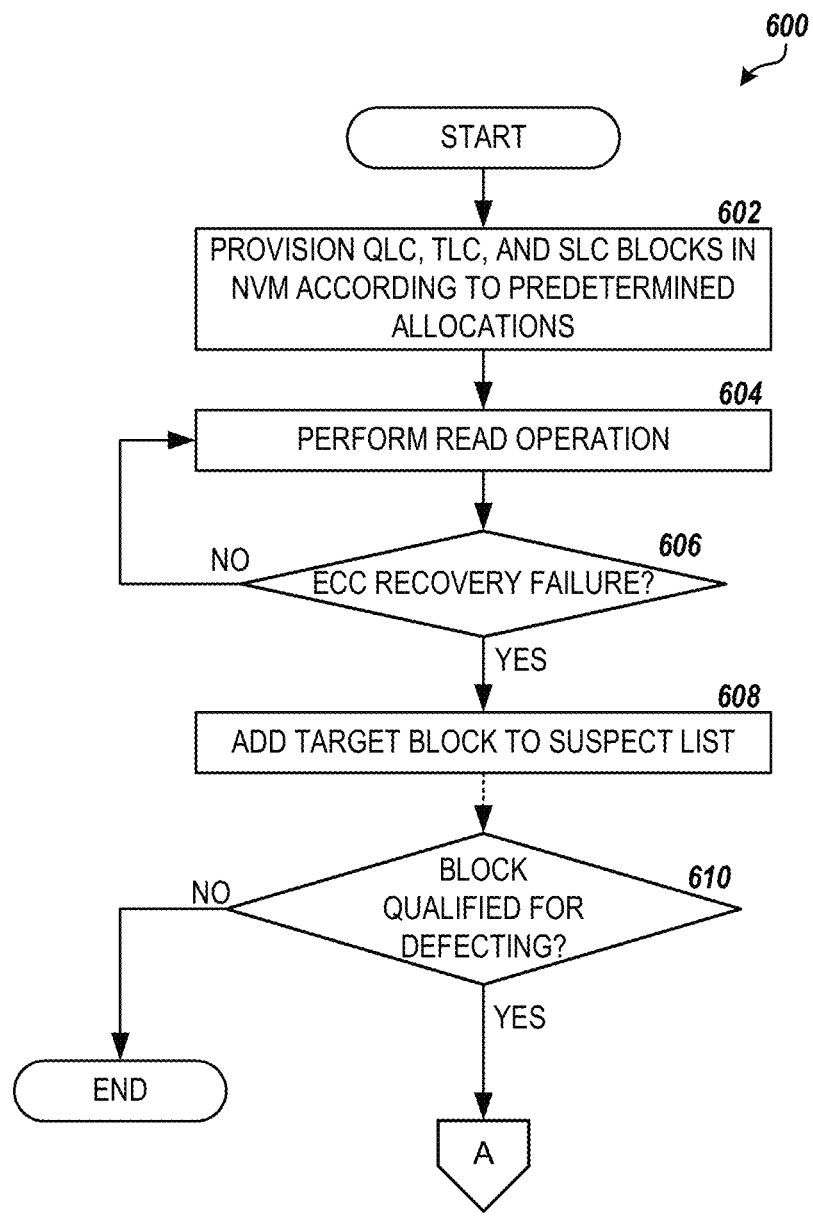
FIGS. 6A and 6B are flow diagrams showing a routine for implementing the scheme for extending the lifespan of an SSD by using worn-out MLC blocks in SLC mode shown in FIG. 5, according to embodiments described herein.
Figure 6B:
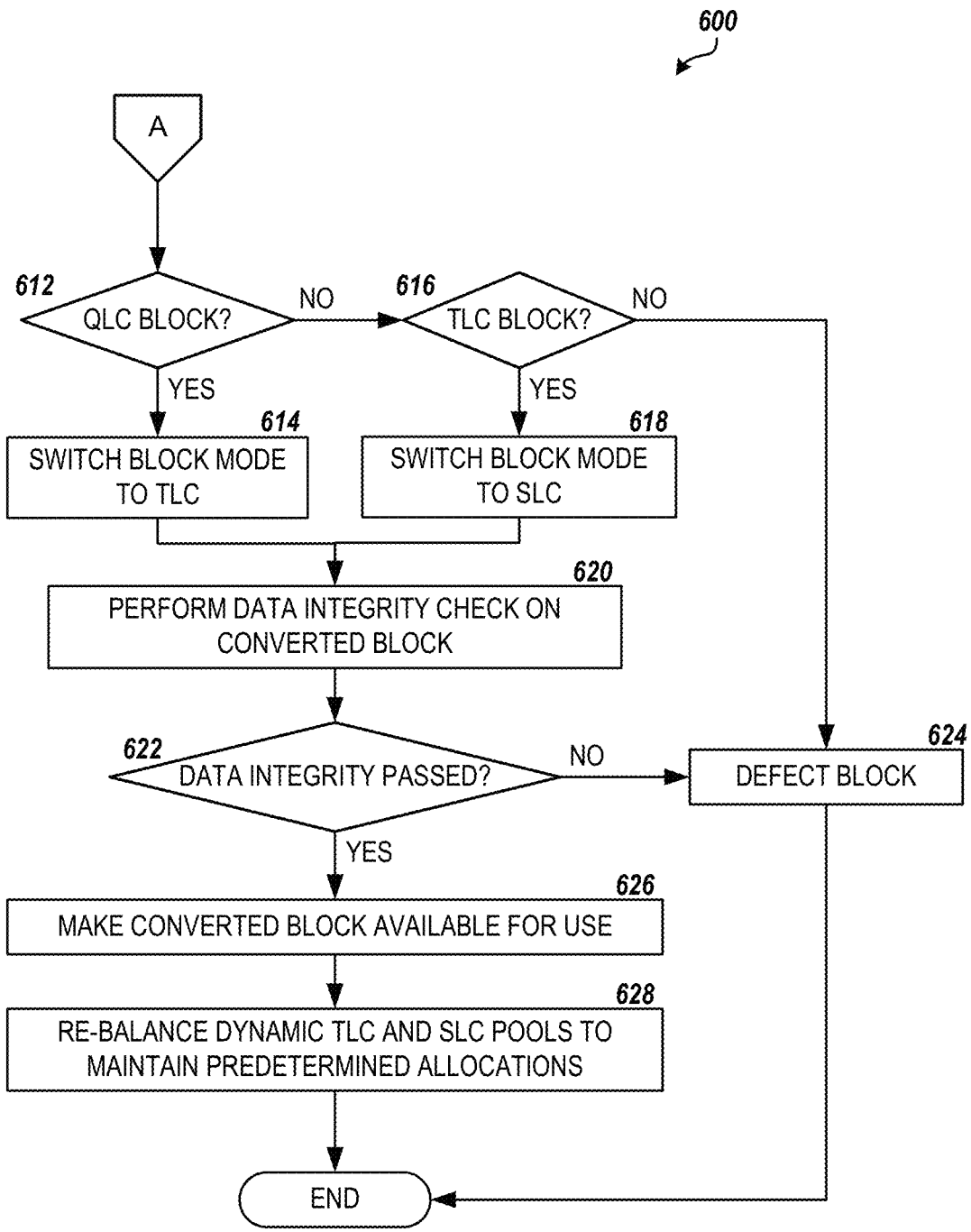

FIGS. 6A and 6B illustrate a routine 600 for implementing the scheme for extending the lifespan of an SSD by using worn-out MLC blocks in SLC mode shown in FIG. 5, according to some embodiments. According to embodiments, the routine 600 may be performed at least in part by the defect management module 236 in the controller 220 of an SSD or other storage device 200 utilizing MLC-based flash memory, such as QLC NAND flash memory. In further embodiments, the routine 600 may be performed by the controller of the SSD, by external processors or computing systems performing storage processing in the storage device, or by some other combination of modules, processors, and devices.

As shown in FIG. 6A, the routine 600 begins at step 602, where the blocks 304 of the NVM elements 210 of the storage device 200 are provisioned according to predetermined proportions of QLC, TLC, and SLC blocks at BOL. In some embodiments, the proportions of blocks 304 operating in TLC mode and blocks operating in SLC mode to all blocks in the flash memory will be maintained through the lifetime of the storage device 200. This provides for consistent capacity and performance of the device over its lifespan. According to embodiments, the predetermined proportions of TLC and/or SLC blocks to all blocks may be set per device, per die (NVM element 210), or at some other level.

From step 602, the routine 600 proceeds to step 604, where the controller 220 of the storage device 200 performs normal read functions. At step 606, the controller 220 determines whether an unrecoverable read error has occurred. For example, a page 302 may be read from an NVM element 210 in which a read error is detected that cannot be resolved by the ECC module 233. If an unrecoverable read error is detected by the controller 220, the routine 600 proceeds from step 606 to step 608, where the controller 220 adds the block 304 in which the read error was detected to a suspect list for future defect testing. The suspect list may be stored in the memory 240 of the controller, for example.

At a subsequent time, the defect management module 236 determines whether the block 304 on the suspect list is qualified for defecting, i.e., not usable in its current programming mode, also referred to herein as "worn out." This determination may be performed by the defect management module 236 during some background defect management or garbage collection process, for example. According to some embodiments, the defect management module 236 may perform a series of read tests on the suspect block 304 and record the RBERs. If some number of pages 302 in the block 304 show an elevated RBER, for example, higher than the number of bits that can be corrected by the ECC algorithm utilized for the block, then the defect management module 236 may determine that the block is qualified for defecting. In some embodiments, the defect management module 236 may erase the suspect block 304 before performing the read testing to eliminate transient failure modes such as retention, read disturb, open block, and the like.

If the defect management module 236 determines the block 304 is qualified for defecting, the routine 600 proceeds from step 610 to step 612, as shown in FIG. 6B, where the current programming mode for the block 304 is determined. If the current programming mode for the block 304 is QLC, then the routine proceeds to step 614, where the defect management module 236 switches the mode of the block to TLC. Switching the programming mode of the block 304 to TLC may involve updating the current programming mode of the block to TLC in the list of current block programming modes in the memory 240 of the controller 220, for example. In some embodiments, the ECC algorithm for the block 304 may further be optimized for the new programming mode, allowing for increased overall performance in the device.

If the current programming mode for the block 304 is TLC, then the routine proceeds to step 618, where the defect management module 236 switches the programming mode of the block to SLC. Alternatively, the defect management module 236 may determine the new programming mode for the block based on the results of the read tests performed in step 610, with blocks exhibiting higher RBERs going straight to SLC mode, for example. If, at step 616, it is determined that the current programming mode for the block is already at SLC, then the routine proceeds to step 624, where the defect management module 236 defects the block 304. For example, the defect management module 236 may add the block 304 to the defective blocks list maintained in the memory 240 of the controller 220.

From step 614 or 618, the routine 600 proceeds to step 620, where the defect management module 236 performs a data integrity check on the converted block using the new programming mode. This may be performed in a similar fashion to the read tests performed on the block 304 in step 610, including erasing the block. If the converted block 304 does not pass the data integrity check, the routine proceeds to step 624, where the defect management module 236 defects the block 304. Alternatively, the defect management module 236 may further reduce the programming mode of the block, e.g., switch the mode of the block from TLC to SLC, and re-perform the data integrity test at step 620. If the converted block 304 passes the data integrity check, then the routine proceeds from step 622 to step 626, where the defect management module 236 makes the converted block 304 available for use in the new programming mode. For example, the block 304 may be marked as invalid allowing the garbage collection module 234 to process the block in the next garbage collection cycle. In some embodiments, the garbage collection module 234 may disintegrate the current garbage collection unit ("GCU") containing the block 304, freeing up the block, and then reconstruct a new GCU containing the block and other blocks with the same programming mode.

Next, at step 628, the defect management module 236 rebalances the dynamic TLC pool 504 and the dynamic SLC pool 506 based on the new mode of the converted block in order to maintain the predetermined proportions of QLC, TLC, and SLC blocks established at BOL. For example, if a QLC block 304 was switched to TLC mode, then the block is counted among the static TLC blocks 508, and the defect management module 236 will convert a block from the dynamic TLC pool 504 to QLC mode to maintain the proportions of QLC and TLC blocks in the flash memory. Similarly, if a static TLC block 508 was switched to SLC mode, then the block is counted among the static SLC blocks 508, and the defect management module 236 will convert a block from the dynamic SLC pool 504 to TLC mode to maintain the proportions of TLC and SLC blocks in the flash memory. From step 628, the routine 600 ends.

It will be appreciated that, if either the dynamic TLC pool 504 or dynamic SLC pool 506 become exhausted as the storage device 200 approaches EOL, the defect management module 236 may alter the process of deciding what to do with a worn-out block shown at steps 612 and 616. For example, if a QLC block 502 becomes unusable in QLC mode, but no blocks are available in the dynamic TLC pool 504, the defect management module 236 may convert the block directly to SLC mode, or may convert an existing static TLC block 508 to SLC mode and the QLC block to TLC mode, with a block from the dynamic SLC pool 506 being converted to a QLC block 502. In other embodiments, once one or both of the dynamic TLC pool 504 and dynamic SLC pool 506 are exhausted, the defect management module 236 may revert to a conventional end-of-life routine for dealing with defective blocks, such as adding them to the defective blocks list, potentially impacting the capacity and performance of the storage device 200.

It will be further appreciated that, while the routine 600 describes switching blocks 304 between QLC, TLC, and SLC modes, similar routines could be utilized in an SSD or other storage device 200 to switch blocks between MLC and SLC modes, between TLC, MLC, and SLC modes, or between any other combination of higher-level and lower-level programming modes, as the blocks become unusable in the higher-level mode(s). It is intended that this disclosure include all such routines for switching blocks between programming modes.

In further embodiments, an SSD or other storage device 200 utilizing multiple NVM elements 210, such as multiple NAND flash dies, may implement additional higher-level redundancy mechanisms for recovering from read errors that are uncorrectable with ECC. One example of higher-level redundancy in SSDs is redundant arrays of independent silicon elements ("RAISE"). According to embodiments, RAISE provides intra-device redundancy across the multiple flash dies 210, with one die, or a portion thereof, reserved for storing redundancy information. When a read of a page 302 or block 304 from a RAISE "stripe" results in an error that is uncorrectable by ECC, the redundancy information stored in the stripe can be used to correct the error.

Figure 7:
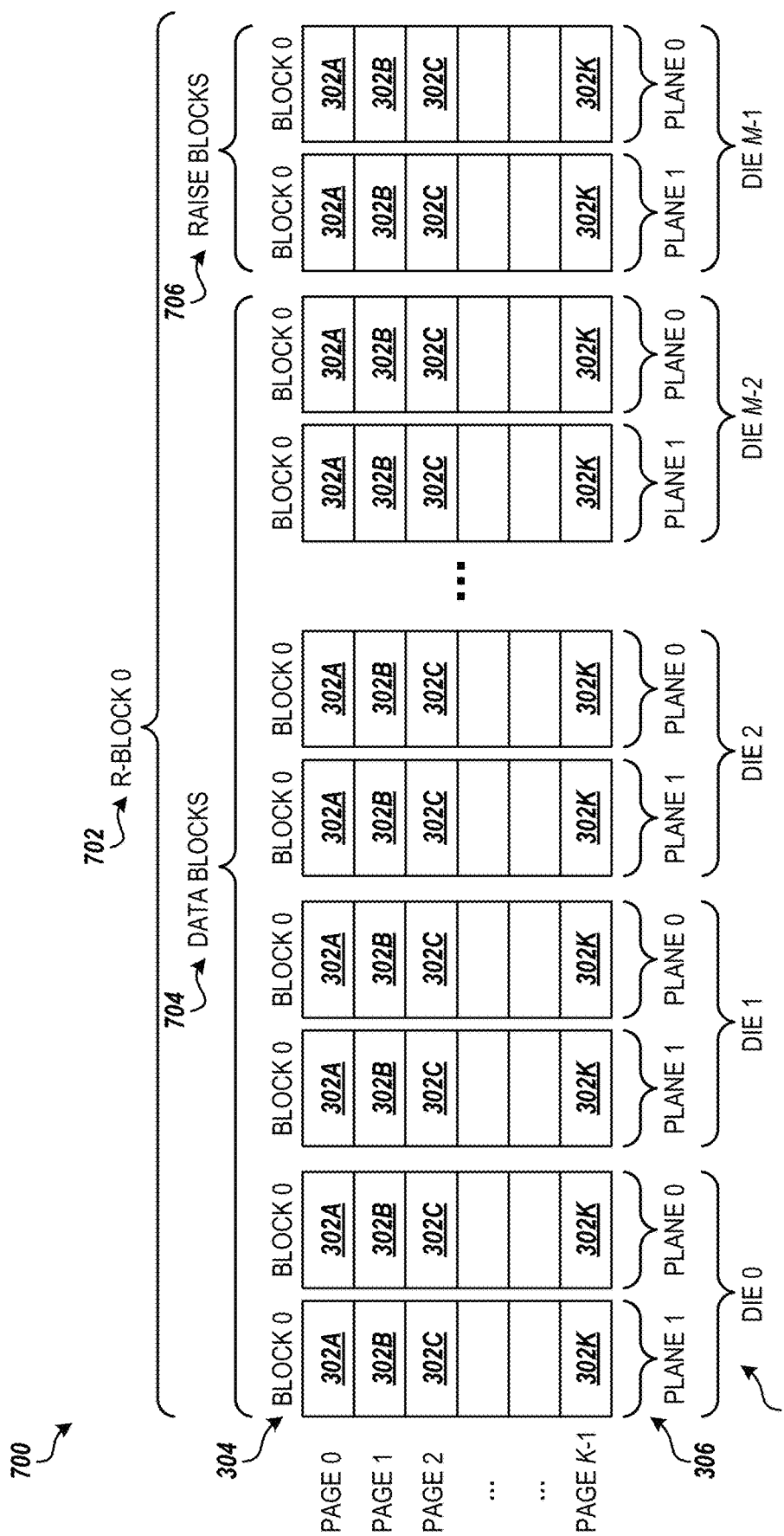
FIG. 7 is a block diagram showing an exemplary storage layout across multiple flash dies in a storage device incorporating Redundant Array of Independent Silicon Elements ("RAISE"), according to embodiments described herein.

FIG. 7 provides an exemplary storage layout 700 of an SSD or storage device 200 implementing multiple NAND flash dies 210 and RAISE. As shown in FIG. 7, blocks 304 from each of the dies 210 in the device are logically grouped together to form a stripe or "R-BLOCK" 702, with block(s) from one die utilized to store redundancy information (the RAISE blocks 706), such as the XOR of the other blocks in the R-BLOCK (the data blocks 704). Thus RAISE is orthogonal to ECC, protecting bits across blocks 304 in the same R-BLOCK 702.

In some RAISE implementations, the controller 220 may only support R-BLOCKS 702 comprising aligned physical block(s) 304 from each die 210. For example, as shown in FIG. 7, R-BLOCK 0 702 comprises block 0 304 from each plane 306 of each die 210. In an SSD or other storage device 200 implementing both MLC flash memory and RAISE with support for only aligned physical blocks, it may further be necessary that all blocks 304 within an R-BLOCK 702 implement the same programming mode. Accordingly, if an MLC block 304 is identified for switching to a lower-level programming mode, such as SLC mode, according to any of the methods or routines described herein, the defect management module 236 of the device may not be able to switch the mode of the block to SLC mode if the block belongs to an R-BLOCK 702 containing other MLC blocks. In this scenario, the defect management module 236 may simply mark the identified MLC block 304 as a defect, according to some embodiments. If the entire R-BLOCK 702 containing the defective MLC block 304 is subsequently switched to SLC mode by the controller 220, then the defective block may be switched to SLC mode as well and utilized for storage of data in the new SLC R-BLOCK.

Figure 8A:
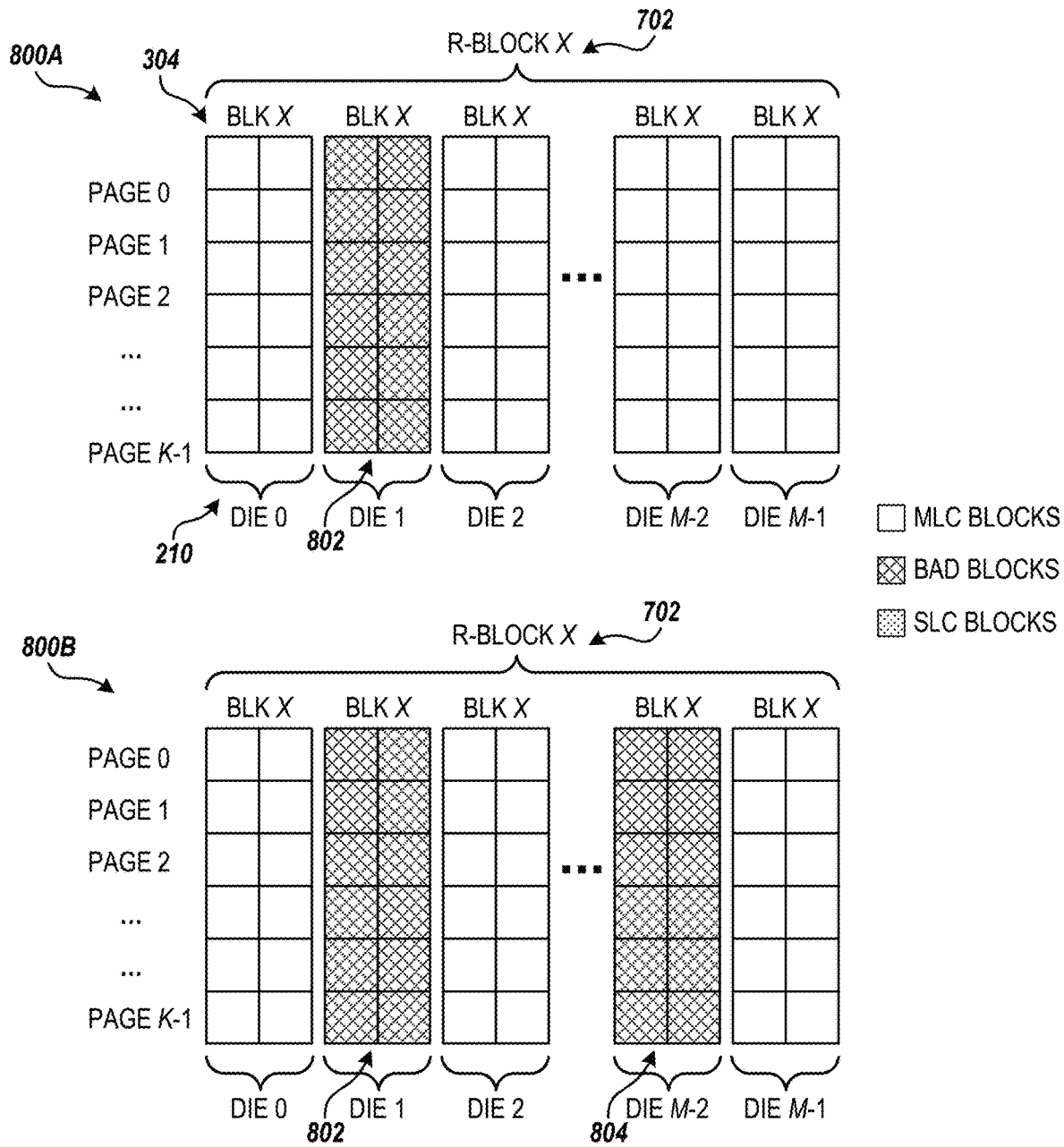
FIGS. 8A and 8B are block diagrams showing details of another scheme for extending the lifespan of an SSD by using worn-out MLC blocks in SLC mode in a storage device incorporating RAISE requiring alignment of blocks across dies, according to embodiments described herein.
Figure 8B:
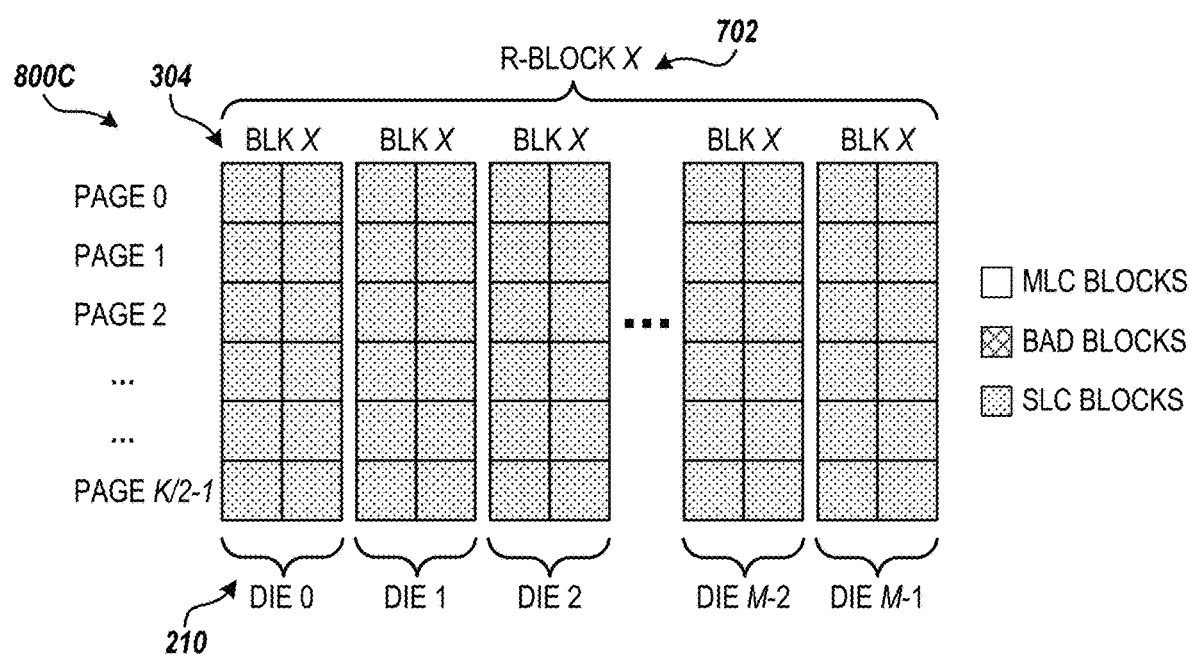

FIGS. 8A and 8B show an exemplary R-BLOCK X 702 in a storage device 200 implementing MLC flash memory and RAISE with support for only aligned physical blocks, according to some embodiments. R-BLOCK X 702 comprises of block X 304 from each of M flash dies 210, all being accessed in MLC mode. As shown at 800A, the block(s) 304 of one flash die 210, such as DIE 1, may become unusable in MLC mode. According to embodiments, because block X of DIE 1 belongs to R-BLOCK X 702 containing other MLC blocks, the defect management module 236 cannot switch the block to SLC mode and therefore marks the block(s) as defects and removes the block(s) from the R-BLOCK, as shown at 802. Subsequently, other blocks 304 in the R-BLOCK 702 may be defected as well, such as the block(s) of DIE M−2 shown at 804 in 800B.

In some embodiments, the defect management module 236 or some other module of the controller 220 may switch the entire R-BLOCK X 702 to SLC mode. For example, if additional MLC blocks 304 in R-BLOCK X 702 become unusable in MLC mode, and defecting the blocks would result in the data capacity of the R-BLOCK being less than that of a fully SLC R-BLOCK, then the defect management module 236 may switch all of the blocks in R-BLOCK X to SLC mode, bringing the previously defected blocks of DIE 1 and DIE M−2 back into R-BLOCK, as shown at 800C in FIG. 8B. In further embodiments, the controller 220 may decide to switch an R-BLOCK 702 in the flash memory from MLC mode to SLC mode because, e.g., the controller intends to use the R-BLOCK for storage of internal system data requiring higher reliability and faster access times, such as mapping tables. If some MLC blocks 304 in the R-BLOCK 702 have been previously defected, then the controller may switch those blocks to SLC mode and bring the blocks back into R-BLOCK when the entire R-BLOCK is converted to SLC.

Figure 9:
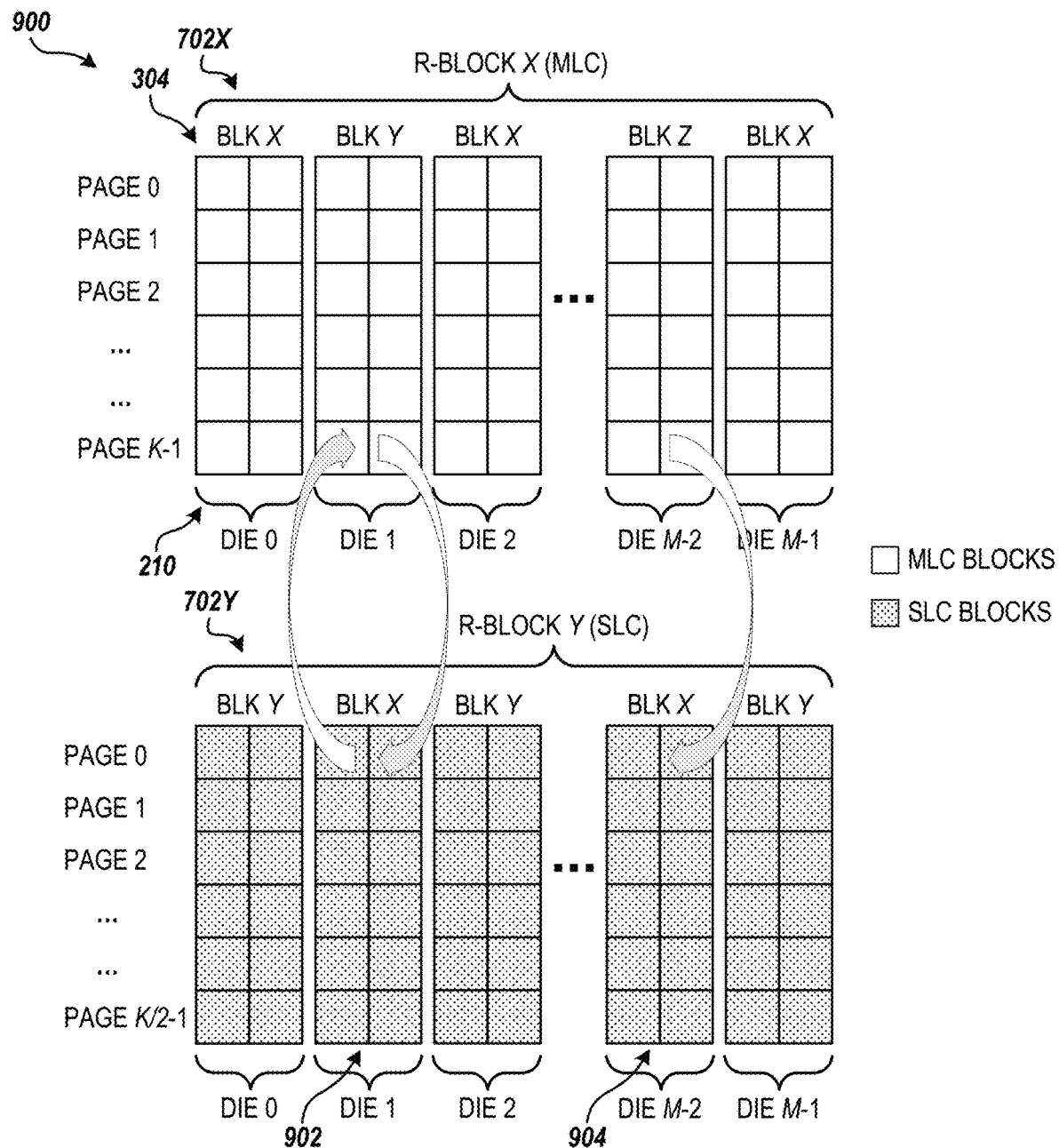
FIG. 9 is a block diagram showing details of another scheme for extending the lifespan of an SSD by using worn-out MLC blocks in SLC mode in a storage device incorporating RAISE not requiring alignment of blocks across dies, according to embodiments described herein.

According to further embodiments, the controller 220 of a storage device 200 implementing MLC flash memory and RAISE may allow for non-aligned blocks 304 in an R-BLOCK 702. For example, as shown at 900 in FIG. 9, R-BLOCK X 702X may be an MLC R-BLOCK comprising of MLC blocks 304. If one or more blocks 304 of R-BLOCK X 702X become unusable in MLC mode, such as the blocks in DIE 1 or DIEM−2, the defect management module 236 of the controller 220 may switch these blocks to SLC mode and reassign those blocks to an SLC R-BLOCK, such as R-BLOCK Y 702Y, as shown at 902 and 904. In some embodiments, the reassignment may be effected by swapping blocks on the same die 210 between R-BLOCK X 702X and R-BLOCK Y 702Y, switching the respective blocks to the correct programming mode for the newly assigned R-BLOCK, as shown at 902. In further embodiments, the reassignment may be alternatively or additionally effected by moving the block 304 switched to SLC mode to the SLC R-BLOCK Y 702Y, while selecting a free MLC block from a different R-BLOCK or pool of free MLC blocks on the die 210 for assignment to the MLC R-BLOCK X 702X, as shown at 904. In this configuration, the RAISE architecture could easily coexist with the scheme described above in regard to FIG. 5 for preserving the performance and capacity rating of the storage device 200 by maintaining a consistent total capacity of blocks operating in MLC mode and blocks operating in SLC mode.

Figure 10:
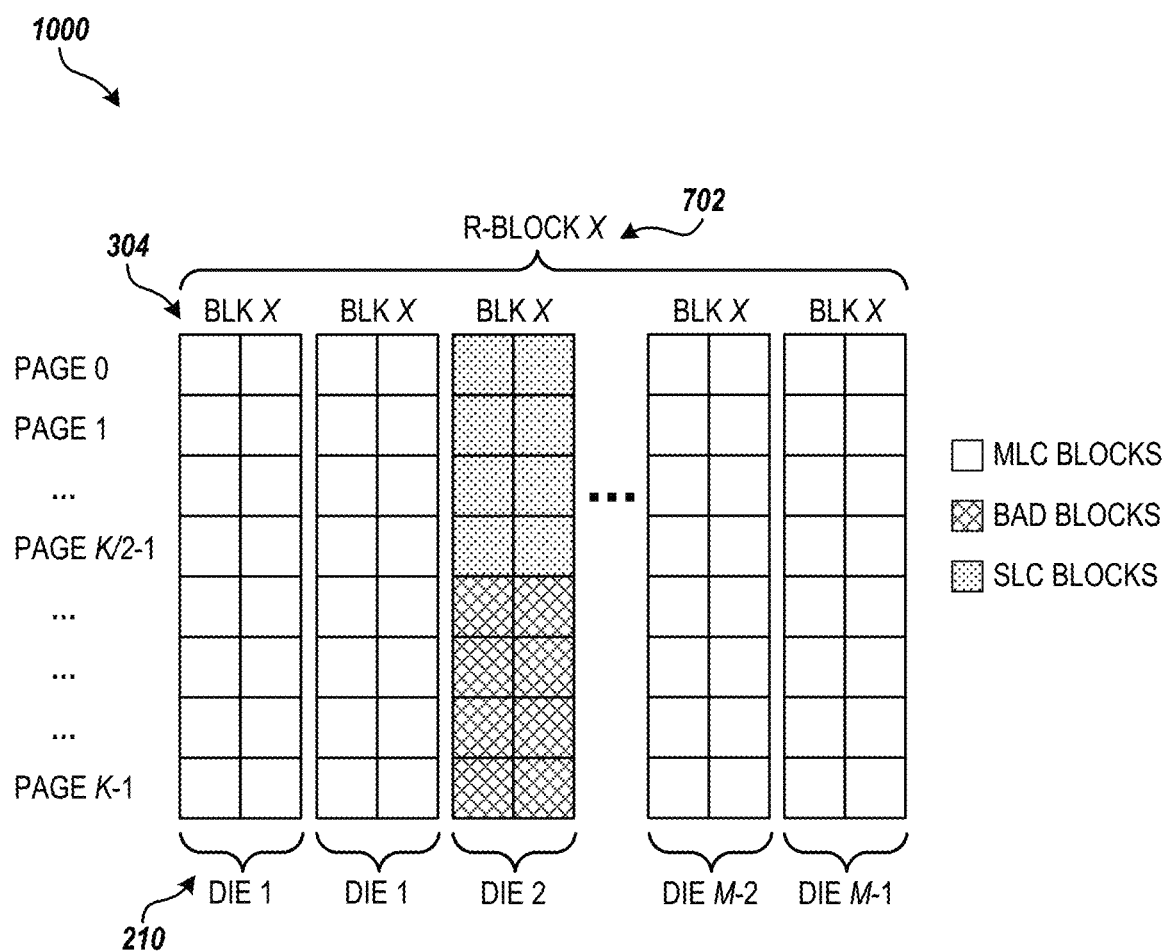
FIG. 10 is a block diagram showing details of another scheme for extending the lifespan of an SSD by using worn-out MLC blocks in SLC mode in a storage device incorporating RAISE allowing mixing of MLC and SLC blocks in a same R-BLOCK, according to embodiments described herein.

In further embodiments, the controller 220 of a storage device 200 implementing MLC flash memory and RAISE may allow for the mixing of MLC blocks and SLC blocks in an R-BLOCK 702. For example, as shown at 1000 in FIG. 10, R-BLOCK X 702 may comprise MLC blocks X 304 from each of M flash dies 210, with block(s) X from one die, such as DIE 2, having been switched to SLC mode due to no longer being usable in MLC mode. According to embodiments, R-BLOCK X 702 is still useable as a RAISE block, with block X 304 from DIE 2 210 accessed in SLC mode and contributing to only half of the pages 302 (page 0 through page K/2−1) in the R-BLOCK, the remaining pages K/2 through K−1 not storing data in the block (i.e., accessed as if block X in DIE 2 was a defective block). When an R-BLOCK 702 contains a mixture of MLC and SLC blocks, it may be necessary to erase, program, and read each block 304 separately in the applicable programming mode.

While the embodiments shown in FIGS. 8A-10 and disclosed herein are described as containing blocks 304 switched between MLC and SLC modes, it will be appreciated that the embodiments could be utilized with blocks accessed in and switched between any programming modes, including QLC, TLC, MLC, and SLC modes. It is intended that this disclosure include all such modes.

Based on the foregoing, it will be appreciated that technologies for extending the lifespan of an SSD by using worn-out MLC flash blocks in SLC mode to extend their useful life are presented herein. While embodiments are generally described herein in regard to an SSD implementing MLC NAND flash storage, it will be appreciated that the embodiments described in this disclosure may be utilized in any storage device implementing MLC technology. This may include SSDs, hybrid magnetic and solid-state drives, USB flash drives, memory cards and cartridges, and the like utilizing MLC NAND flash, MLC NOR flash, MLC phase change memory ("PCM"), and the like. The above-described embodiments are merely possible examples of implementations, merely set forth for a clear understanding of the principles of the present disclosure.

The logical operations, functions, or steps described herein as part of a method, process or routine may be implemented (1) as a sequence of processor-implemented acts, software modules, or portions of code running on a controller or computing system and/or (2) as interconnected machine logic circuits or circuit modules within the controller or computing system. The implementation is a matter of choice dependent on the performance and other requirements of the system. Alternate implementations are included in which operations, functions or steps may not be included or executed at all, may be executed out of order from that shown or discussed, including substantially concurrently or in reverse order, depending on the functionality involved, as would be understood by those reasonably skilled in the art of the present disclosure.

It will be further appreciated that conditional language, such as, among others, "can," "could," "might," or "may,"

unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more particular embodiments or that one or more particular embodiments necessarily include logic for deciding, with or without user input or prompting, whether these features, elements and/or steps are included or are to be performed in any particular embodiment.

Many variations and modifications may be made to the above-described embodiments without departing substantially from the spirit and principles of the present disclosure. Further, the scope of the present disclosure is intended to cover any and all combinations and sub-combinations of all elements, features, and aspects discussed above. All such modifications and variations are intended to be included herein within the scope of the present disclosure, and all possible claims to individual aspects or combinations of elements or steps are intended to be supported by the present disclosure.

What is claimed is:

1. A method comprising steps of:
   identifying a first storage location in a storage media of a storage device as a candidate for defecting;
   in response to identifying the first storage location as a candidate for defecting, switching the first storage location from a first programming mode to a second programming mode, the second programming mode resulting in a lower storage density of the first storage location than the first programming mode; and
   in conjunction with switching the first storage location, switching a second storage location in the storage media from the second programming mode to the first programming mode such that a predetermined proportion of storage locations utilizing the second programming mode to a total number of storage locations on the storage media is maintained.

2. The method of claim 1, wherein the storage media comprises a first portion of storage locations configured to be programmed with the first programming mode and a second portion of storage locations configured to be programmed with the second programming mode, the number of storage locations comprising the first portion and the second portion based on the predetermined proportion, and wherein the second storage location is selected from the second portion.

3. The method of claim 2, further comprising the steps of:
   in response to identifying the first storage location as a candidate for defecting, determining if the second portion contains storage locations eligible for switching to the first programming mode based on the predetermined proportion; and
   in response to determining that the second portion does not contain storage locations eligible for switching to the first programming mode, mark the first storage location as a defect.

4. The method of claim 2, wherein the storage media comprises a third portion of storage locations configured to be programmed with a third programming mode, the third programming mode resulting in a lower storage density of storage locations than the first programming mode or the second programming mode, the method further comprising steps of:
   identifying a third storage location in the second portion of storage locations as a candidate for defecting;
   in response to identifying the third storage location as a candidate for defecting, switching the third storage location from the second programming mode to the third programming mode; and
   in conjunction with switching the third storage location, switching a fourth storage location in the storage media from the third programming mode to the second programming mode, the fourth storage location belonging to the third portion of storage locations.

5. The method of claim 1, further comprising the steps of:
   in response to switching the first storage location to the second programming mode, testing the first storage location using the second programming mode;
   upon the first storage location passing the testing, making the first storage location available for use in the second programming mode; and
   upon the first storage location failing the testing, marking the first storage location as a defect.

6. The method of claim 1, wherein identifying the first storage location as a candidate for defecting comprises one of detecting an unrecoverable read error in the first storage location and detecting a high raw bit error rate in the first storage location.

7. The method of claim 1, wherein the storage media comprises NAND flash memory.

8. The method of claim 7, wherein the storage locations comprise blocks of multi-level cells ("MLC"), and wherein the first programming mode comprises quad-level cell ("QLC") mode and the second programming mode comprises triple-level cell ("TLC") mode.

9. The method of claim 1, wherein the storage device comprises a solid-state disk ("SSD") device.

10. A storage device comprising:
    a non-volatile memory comprising a plurality of storage locations, a first portion of the storage locations configured to be programmed in a first programming mode and a second portion of the storage locations configured to be programmed in a second programming mode, the second programming mode resulting in a lower storage density of the storage locations than the first programming mode; and
    a controller for storing user data from a host to the non-volatile memory, the controller configured to
    detect an error in a first storage location within the first portion of the storage locations,
    in response to detecting the error, switch the first storage location from the first programming mode to the second programming mode, and
    in conjunction with switching the first storage location, switch a second storage location within the second portion of the storage locations from the second programming mode to the first programming mode such that a predetermined proportion of storage locations utilizing the first programming mode to storage locations utilizing the second programming mode in the non-volatile memory is maintained.

11. The storage device of claim 10, wherein the controller is further configured to:
    in response to detecting the error in the first storage location, determine if the second portion contains storage locations eligible for switching to the first programming mode based on the predetermined proportion; and
    in response to determining that the second portion does not contain storage locations eligible for switching to the first programming mode, mark the first storage location as a defect.

12. The storage device of claim 10, wherein the non-volatile memory comprises a third portion of the storage locations configured to be programmed in a third programming mode, the third programming mode resulting in a lower storage density of the storage locations than the first programming mode or the second programming mode, the controller further configured to:
- detect an error in a third storage location within the second portion of the storage locations;
- in response to detecting the error, switch the third storage location from the second programming mode to the third programming mode; and
- in conjunction with switching the third storage location, switching a fourth location within the third portion of the storage locations from the third programming mode to the second programming mode.

13. The storage device of claim 12, wherein the non-volatile memory comprises NAND flash memory, the storage locations comprising blocks of multi-level cells ("MLC"), and wherein the first programming mode comprises quad-level cell ("QLC") mode, the second programming mode comprises triple-level cell ("TLC") mode, and the third programming mode comprises single-level cell ("SLC") mode.

14. The storage device of claim 10, wherein the controller is further configured to:
- in response to switching the first storage location to the second programming mode, test the first storage location using the second programming mode;
- upon the first storage location passing the testing, make the first storage location available for use in the second programming mode; and
- upon the first storage location failing the testing, mark the first storage location as a defect.

15. A non-transitory computer-readable storage medium containing processor-executable instructions that, when executed by a processor, cause the processor to:
- initially provision a non-volatile memory of a storage device with a first pool of storage locations configured to utilize a multi-level cell ("MLC") mode and a second pool of storage locations configured to utilize single-level cell ("SLC") mode, a size of the first pool and the second pool of the storage locations based on a predetermined proportion of storage locations utilizing the MLC mode to storage locations utilizing SLC mode for the storage device;
- identify a first storage location in the first pool as a candidate for defecting;
- in response to identifying the first storage location as a candidate for defecting, switch the first storage location from the MLC mode to SLC mode; and
- in conjunction with switching the first storage location, switch a second storage location in the second pool from SLC mode to the MLC mode such that the predetermined proportion of storage locations utilizing the MLC mode to storage locations utilizing SLC mode for the storage device is maintained.

16. The non-transitory computer-readable storage medium of claim 15, wherein identifying the first storage location as a candidate for defecting comprises detecting an unrecoverable read error in the first storage location.

17. The non-transitory computer-readable storage medium of claim 15, containing further computer executable instructions that cause the processor to:
- in response to identifying the first storage location as a candidate for defecting, determine if the second pool contains storage locations eligible for switching to the MLC mode based on the predetermined proportion; and
- in response to determining that the second pool does not contain storage locations eligible for switching to the MLC mode, mark the first storage location as a defect.

18. The non-transitory computer-readable storage medium of claim 15, wherein the non-volatile memory comprises NAND flash memory, the storage locations comprising blocks of quad-level cells ("QLC"), and wherein the MLC mode comprises QLC mode.

* * * * *